(12) United States Patent
Wang

(10) Patent No.: US 11,139,457 B2
(45) Date of Patent: Oct. 5, 2021

(54) OLED, METHOD FOR FABRICATING THE SAME, DISPLAY DEVICE

(71) Applicant: BOE TECHNOLOGY GROUP CO., LTD., Beijing (CN)

(72) Inventor: Xinxin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 224 days.

(21) Appl. No.: 15/539,742

(22) PCT Filed: Nov. 25, 2016

(86) PCT No.: PCT/CN2016/107189
§ 371 (c)(1),
(2) Date: Jun. 26, 2017

(87) PCT Pub. No.: WO2017/088807
PCT Pub. Date: Jun. 1, 2017

(65) Prior Publication Data
US 2017/0365817 A1    Dec. 21, 2017

(30) Foreign Application Priority Data
Nov. 25, 2015  (CN) .......................... 201510828776.7

(51) Int. Cl.
*H01L 51/52* (2006.01)
*H01L 51/50* (2006.01)
(Continued)

(52) U.S. Cl.
CPC ...... *H01L 51/5275* (2013.01); *H01L 51/0003* (2013.01); *H01L 51/0014* (2013.01);
(Continued)

(58) Field of Classification Search
CPC ..... H01L 51/50; H01L 51/5218; H01L 51/56; H01L 51/5228; H01L 51/5092;
(Continued)

(56) References Cited

U.S. PATENT DOCUMENTS 6,278,236 B1 * 8/2001 Madathil ............. H01L 51/5092
313/504
6,929,869 B1 * 8/2005 Wood ..................... C09K 11/06
313/504
(Continued)

FOREIGN PATENT DOCUMENTS

CN         101882666 A      11/2010
CN         102074660 A       5/2011
(Continued)

OTHER PUBLICATIONS

Gather et al., "Recent advances in light outcoupling from white organic light-emitting diodes," Journal of Photonics for Energy, vol. 5, 2015, 057607-1-057607-20.*
(Continued)

*Primary Examiner* — Allen L Parker
*Assistant Examiner* — Charles N Ausar-El
(74) *Attorney, Agent, or Firm* — Calfee, Halter & Griswold LLP

(57) ABSTRACT

An OLED, a method for fabricating the same, and a display device are disclosed. The OLED includes a first electrode, a first carrier transporting layer, an organic light emitting layer, a second carrier transporting layer, a second electrode, and a light extracting layer between the first electrode and the organic light emitting layer. The light extracting layer is made from a first carrier transporting material. The light extracting layer is formed between the first electrode and the organic light emitting layer at a light exit side of the OLED, and is formed from the first carrier transporting material.
(Continued)

This increases the light extracting efficiency of the OLED. The light extracting layer further acts as the first carrier transporting layer, thus simplifying the structure of OLED, making OLED easy to fabricate, and efficiently controlling cost.

10 Claims, 3 Drawing Sheets

(51) Int. Cl.
  *H01L 51/56* (2006.01)
  *H01L 51/00* (2006.01)
(52) U.S. Cl.
  CPC ...... *H01L 51/0026* (2013.01); *H01L 51/5072* (2013.01); *H01L 51/5092* (2013.01); *H01L 51/5228* (2013.01); *H01L 51/56* (2013.01); *H01L 51/508* (2013.01); *H01L 51/5056* (2013.01); *H01L 51/5076* (2013.01); *H01L 51/5218* (2013.01); *H01L 51/5234* (2013.01); *H01L 2251/303* (2013.01); *H01L 2251/308* (2013.01); *H01L 2251/5353* (2013.01); *H01L 2251/558* (2013.01)
(58) Field of Classification Search
  CPC ............. H01L 51/0072; H01L 51/0026; H01L 51/0014; H01L 51/0003; H01L 51/5275; H01L 51/5056; H01L 51/5076; H01L 51/508; H01L 51/5234; H01L 2251/303; H01L 2251/308; H01L 2251/5353; H01L 2251/558
  USPC .......................................................... 257/40
  See application file for complete search history.

(56) References Cited

U.S. PATENT DOCUMENTS

| | | | | |
|---|---|---|---|---|
| 6,965,197 | B2* | 11/2005 | Tyan | H01L 51/5268 313/504 |
| 8,298,032 | B2* | 10/2012 | Potts | B82Y 30/00 445/24 |
| 8,367,221 | B2* | 2/2013 | Qiu | H01L 51/5092 428/690 |
| 8,476,624 | B1* | 7/2013 | Wu | H01L 51/5004 257/40 |
| 8,659,221 | B2* | 2/2014 | Jones | B82Y 20/00 313/506 |
| 8,692,446 | B2* | 4/2014 | Zhang | B82Y 20/00 313/116 |
| 9,048,447 | B2* | 6/2015 | Cho | H01L 51/5044 |
| 9,219,249 | B2* | 12/2015 | Stromer | H01L 51/0015 |
| 9,577,221 | B2* | 2/2017 | Weaver | H01L 51/5044 |
| 9,673,421 | B2* | 6/2017 | Sun | H01L 51/56 |
| 9,692,007 | B2* | 6/2017 | Liao | H01L 51/52 |
| 9,716,228 | B2* | 7/2017 | Xiao | H01L 51/001 |
| 9,780,337 | B2* | 10/2017 | Yang | H01L 51/5275 |
| 9,818,810 | B2* | 11/2017 | Ma | H01L 51/56 |
| 9,818,983 | B2* | 11/2017 | Hao | C08L 43/04 |
| 9,853,231 | B2* | 12/2017 | Jung | H01L 51/5278 |
| 9,881,985 | B2* | 1/2018 | Li | H01L 27/3248 |
| 9,899,629 | B2* | 2/2018 | Wang | H01L 27/323 |
| 10,205,107 | B2* | 2/2019 | Wallikewitz | H01L 51/0003 |
| 2002/0187895 | A1 | 12/2002 | Izaki et al. | |
| 2005/0006641 | A1* | 1/2005 | Tung | H01L 51/5036 257/40 |
| 2006/0040132 | A1* | 2/2006 | Liao | H01L 51/5036 428/690 |
| 2006/0186792 | A1* | 8/2006 | Lee | H01L 51/5092 313/503 |
| 2006/0240280 | A1* | 10/2006 | Liao | H05B 33/26 428/690 |
| 2007/0026257 | A1* | 2/2007 | Begley | H01L 51/5096 428/690 |
| 2007/0037010 | A1* | 2/2007 | Vestweber | H01L 51/5016 428/690 |
| 2007/0194704 | A1* | 8/2007 | Koyama | H01L 51/5088 313/506 |
| 2008/0054783 | A1* | 3/2008 | Xia | H01L 51/506 313/483 |
| 2008/0211390 | A1* | 9/2008 | D'Andrade | H01L 51/5265 313/504 |
| 2008/0218063 | A1* | 9/2008 | Greiner | H01L 51/5012 313/504 |
| 2009/0015142 | A1* | 1/2009 | Potts | H01L 51/5268 313/504 |
| 2009/0015757 | A1* | 1/2009 | Potts | B82Y 30/00 349/69 |
| 2009/0072717 | A1* | 3/2009 | Yang | H01L 51/5036 313/504 |
| 2009/0191427 | A1* | 7/2009 | Liao | H01L 51/5096 428/690 |
| 2010/0045174 | A1* | 2/2010 | Okabe | H05B 33/14 313/504 |
| 2010/0133529 | A1* | 6/2010 | Taraschi | H01L 33/0093 257/43 |
| 2010/0150513 | A1* | 6/2010 | Zhang | H01L 51/5275 385/131 |
| 2011/0043102 | A1* | 2/2011 | Lee | C09K 11/06 313/504 |
| 2011/0163299 | A1* | 7/2011 | Shi | H01L 51/0077 257/40 |
| 2011/0168976 | A1 | 7/2011 | Mao | |
| 2011/0175513 | A1* | 7/2011 | Jeong | H01L 51/5281 313/113 |
| 2011/0180792 | A1* | 7/2011 | Lee | C09K 11/06 257/40 |
| 2011/0260148 | A1* | 10/2011 | Lee | H01L 51/5262 257/40 |
| 2012/0098011 | A1* | 4/2012 | Choi | H01L 27/3209 257/98 |
| 2012/0098012 | A1* | 4/2012 | Kim | H01L 27/3209 257/98 |
| 2012/0119191 | A1* | 5/2012 | Dorok | C07F 9/65583 257/40 |
| 2012/0234460 | A1* | 9/2012 | Zhang | H01L 51/5268 156/67 |
| 2013/0009131 | A1* | 1/2013 | Kazlas | B82Y 20/00 257/13 |
| 2013/0037787 | A1 | 2/2013 | Stromer et al. | |
| 2013/0051032 | A1* | 2/2013 | Jones | H01L 51/5271 362/335 |
| 2013/0062599 | A1* | 3/2013 | Holmes | H01L 51/5008 257/40 |
| 2013/0320368 | A1* | 12/2013 | Seo | H01L 27/3206 257/89 |
| 2013/0324909 | A1* | 12/2013 | Aydt | A61F 9/00834 604/20 |
| 2013/0330505 | A1* | 12/2013 | Park | H01L 51/5268 428/131 |
| 2014/0042422 | A1* | 2/2014 | Silverman | H01L 51/5275 257/40 |
| 2014/0061591 | A1 | 3/2014 | Chichak et al. | |
| 2014/0061600 | A1* | 3/2014 | Kim | H01L 27/3211 257/40 |
| 2014/0084269 | A1* | 3/2014 | Weaver | H01L 51/52 257/40 |
| 2014/0091292 | A1* | 4/2014 | Baker | H01L 51/5262 257/40 |
| 2014/0332795 | A1* | 11/2014 | Guimard | C03C 17/36 257/40 |
| 2015/0028310 | A1* | 1/2015 | Dai | H01L 27/3246 257/40 |
| 2015/0144890 | A1* | 5/2015 | Ma | H01L 51/5275 257/40 |
| 2015/0228929 | A1* | 8/2015 | Lamansky | H01L 27/3244 257/40 |

(56) References Cited

U.S. PATENT DOCUMENTS

| | | | | |
|---|---|---|---|---|
| 2015/0228931 A1* | 8/2015 | Lamansky | .......... | H01L 51/5275 257/40 |
| 2015/0380466 A1* | 12/2015 | Koo | .......... | H01L 51/5275 257/40 |
| 2016/0111475 A1* | 4/2016 | Ohara | .......... | H01L 51/5044 257/40 |
| 2016/0116696 A1* | 4/2016 | Modavis | .......... | G02B 6/12004 385/14 |
| 2016/0118603 A1* | 4/2016 | Cardinali | .......... | C09K 11/06 257/40 |
| 2016/0268553 A1* | 9/2016 | Free | .......... | H01L 51/5275 |
| 2017/0040405 A1* | 2/2017 | Zhang | .......... | H01L 51/50 |
| 2017/0047553 A1* | 2/2017 | Yang | .......... | H01L 51/50 |
| 2017/0084873 A1* | 3/2017 | Xu | .......... | H01L 51/5275 |
| 2017/0110689 A1* | 4/2017 | Yang | .......... | H01L 51/56 |
| 2017/0162813 A1* | 6/2017 | Lee | .......... | H01L 51/0052 |
| 2017/0166581 A1* | 6/2017 | Kim | .......... | C07D 495/04 |
| 2017/0186967 A1* | 6/2017 | Hayashi | .......... | H01L 51/0072 |
| 2017/0213982 A1* | 7/2017 | Hayama | .......... | C07D 401/10 |
| 2017/0279077 A1* | 9/2017 | Wang | .......... | H01L 51/5253 |
| 2017/0331075 A1* | 11/2017 | Lee | .......... | H01L 51/0072 |
| 2018/0331300 A1* | 11/2018 | Fadhel | .......... | H01L 51/0071 |
| 2018/0337336 A1* | 11/2018 | Xu | .......... | H01L 27/3248 |
| 2020/0106040 A1* | 4/2020 | Yamamoto | .......... | H01L 51/5044 |

FOREIGN PATENT DOCUMENTS

| | | | |
|---|---|---|---|
| CN | 102738414 A | | 10/2012 |
| CN | 102870249 A | | 1/2013 |
| CN | 103219476 A | | 7/2013 |
| CN | 103746079 A | | 4/2014 |
| CN | 201510218730 | * | 4/2015 |
| CN | 204361101 U | | 5/2015 |
| CN | 105355798 A | | 2/2016 |
| CN | 205264760 U | | 5/2016 |
| JP | 200139712 A | | 2/2001 |
| JP | 2007265659 A | | 10/2007 |
| JP | 2014220159 A | | 11/2014 |
| KR | 20130096531 A | | 8/2013 |
| KR | 1020130095645 A | | 8/2013 |
| KR | 1020150080282 A | | 7/2015 |
| WO | 2010011858 A2 | | 1/2010 |

OTHER PUBLICATIONS

Xu et. al., "Electrode modification in organic light-emitting diodes", Displays 27 (2006) 24-34 (Year: 2005).*
Search Report for International Application No. PCT/CN2016/107189 dated Feb. 24, 2017.
First Office Action for Chinese Patent Application No. 201510828776.7 dated Dec. 2, 2016.
Second Office Action for Chinese Patent Application No. 201510828776,7 dated Mar. 21, 2017.
Third Office Action for Chinese Patent Application No. 201510828776.7 dated Aug. 28, 2017.
Fourth Office Action for Chinese Patent Application No. 201510828776.7 dated Jan. 29, 2018.
Li Jun, Electrode Modification in OLEDs, vol. 9, 2013; Sep. 15, 2013. Published in China, 2 pages.
Yao Hui, Researches on high efficient OLEDs with ZnO electrode modified layer, vol. 5, May 15, 2007. Published in China, 1 page.
Notification of Reason for Refusal for Korean Patent Application No. 10-2017-7017854 dated Apr. 24, 2018.
Decision on Rejection for Chinese Patent Application No. 201510828776.7 dated May 23, 2018.
Notice of Last Preliminary Rejection for Korean Patent Application No. 10-2017-7017854 dated Oct. 23, 2018.
Notice of Final Rejection for Korean Patent Application No. 10-2017-7017854 dated Feb. 28, 2019.
Notice of Amendment Dismissal for Korean Patent Application No. 10-2017-7017854 dated Feb. 28, 2019.
Decision of Reexamination for Chinese Patent Application No. 201510828776.7 dated Jul. 10, 2019.
Extended Search Report for European Patent Application No. 16868030.4 dated May 29, 2019.
Yoshitaka, Kurojaka et al., "Improvement of Electrode/Organic Layer Interfaces by the Insertion of Monolayer-like Aluminium Oxide Film," Japanese Journal of Applied Physics, (1998), vol. 37, pp. L872-L875, Part 2, No. 7B.

* cited by examiner

OLED, METHOD FOR FABRICATING THE SAME, DISPLAY DEVICE

RELATED APPLICATIONS

The present application is the U.S. national phase entry of PCT/CN2016/107189, with an international filing date of Nov. 25, 2016, which claims the benefit of Chinese Patent Application 201510828776.7, filed on Nov. 25, 2015, the entire disclosures of which are incorporated herein by reference.

TECHNICAL FIELD

The present invention relates to the field of display technology, and particularly to an organic light emitting device (OLED), a method for fabricating the same, and a display device comprising the OLED.

BACKGROUND

OLED is a light emitting device in which an organic solid state semiconductor is used as a light emitting material. It will have wide future application due to its advantages of simple process, low cost, low power consumption, high luminance, and a wide range of operation temperature. Currently there is a need for increasing the light extracting efficiency of OLED.

SUMMARY

Embodiments of the present application provide an OLED, a method for fabricating the same, and a display device comprising the OLED, which can efficiently increase the light extracting efficiency of OLED.

In a first aspect, an OLED is provided comprising a first electrode, an organic light emitting layer, a second carrier transporting layer, and a second electrode, wherein the OLED further comprises a light extracting layer which is arranged between the first electrode and the organic light emitting layer, and the light extracting layer is made from a first carrier transporting material.

According to an exemplary embodiment, the light extracting layer is arranged at a light exit side of the OLED, and is formed between the first electrode and the organic light emitting layer. This increases the light extracting efficiency of OLED. The light extracting layer further acts as the first carrier transporting layer, thus simplifying the structure of OLED, making OLED easy to fabricate, and efficiently controlling cost.

In an exemplary embodiment of the OLED, the light extracting layer is arranged close to a light exit side in the OLED.

In an exemplary embodiment of the OLED, a surface of the light extracting layer has a periodic structure.

According to an exemplary embodiment, the surface of the light extracting layer has a periodic structure, thus increasing the light extracting efficiency of OLED.

In an exemplary embodiment of the OLED, the periodic structure comprises one-dimensional prisms which have a triangular or curved cross section, or periodic patterns which are arranged in a matrix.

According to an exemplary embodiment, one-dimensional prisms and periodic patterns which are arranged in a matrix is easy to fabricate. The periodic patterns which are arranged in a matrix comprise micro-lenses which are arranged in a matrix, or the like.

In an exemplary embodiment of the OLED, the light extracting layer is made from a polymer carrier transporting material.

According to an exemplary embodiment, the light extracting layer is made from the polymer carrier transporting material. The polymer material is applied on the first electrode by spin coating, and it is convenient for patterning by nano-imprinting to form the periodic structure. Besides, the polymer material is relatively dense, and the formed light extracting layer isolates the organic light emitting layer from the environment. This prevents environmental factors like moisture from destroying the organic material in the organic light emitting layer, thus increasing the lifetime of OLED.

In an exemplary embodiment of the OLED, the OLED further comprises a first carrier transporting layer which is arranged between the organic light emitting layer and the light extracting layer.

According to an exemplary embodiment, as compared with the existing method, the light extracting layer made from the first carrier transporting material is added between the first carrier transporting layer and the first electrode. The light extracting layer made from the first carrier transporting material improves the light extracting efficiency of OLED. Since the light extracting layer is made from the first carrier transporting material, the process for forming the light extracting layer is compatible with the process for forming the existing OLED, especially the process for forming the first carrier transporting layer, so that it is easy to fabricate and the cost can be efficiently controlled.

In an exemplary embodiment of the OLED, the OLED further comprises an electrode modifying layer which is arranged between the first electrode and the light extracting layer.

According to an exemplary embodiment, the electrode modifying layer between the first electrode and the light extracting layer decreases an interface barrier between the first electrode and the organic material of the organic light emitting layer, so that carriers are injected efficiently, and the performance of OLED increases. Besides, since the interface barrier between the first electrode and the organic material decreases, the joule heat produced by the OLED during operation decreases, which facilitates increasing the lifetime of OLED.

In an exemplary embodiment of the OLED, the electrode modifying layer is made from $Al_2O_3$ or ZnO, and has a thickness of about 1-3 nm.

According to an exemplary embodiment, the electrode modifying material is $Al_2O_3$ or ZnO, so as to decrease the interface barrier between the cathode and the organic material, and increase efficiency for injecting electrons. The electrode modifying layer generally has a thickness about 1-3 nm, for example 1.5 nm or 2 nm. The electrode modifying layer becomes an insulating layer when it is too thick, and this decreases the electrical performance of OLED. Besides, the electrode modifying layer is an $Al_2O_3$ or ZnO film which is formed by spin coating and annealing. The dense electrode modifying layer isolates the organic light emitting layer from the environment, and prevents environmental factors like moisture from destroying the organic material in the organic light emitting layer, thus increasing the lifetime of OLED.

In an exemplary embodiment of the OLED, the first electrode is a cathode, the first carrier transporting layer is an electron transporting layer, the second carrier transporting layer is a hole transporting layer, and the second electrode is a reflective anode.

According to the present embodiment, the OLED has an inverted configuration, and light is output from the cathode. The light extracting layer is arranged at the light exit side, which facilitates increasing the light extracting efficiency of OLED.

In an exemplary embodiment of the OLED, the first electrode comprises ITO.

According to the present embodiment, the OLED is an inverted OLED. The OLED comprises a cathode which is arranged at the bottom and made from ITO. The cathode thus is directly connected with a drain of an n-type TFT, and this facilitates integration of the cathode and TFT to increase stability of the display device. The ITO cathode has a relatively high work function. There a relatively large electron injecting barrier between the ITO cathode and the electron transporting material, which makes it difficult for electrons to inject. The above mentioned electrode modifying layer helps to decrease the injecting barrier for electrons, so that this problem is solved.

In an exemplary embodiment of the OLED, the OLED further comprises an n-doped electron transporting layer which is arranged between the electron transporting layer and the cathode.

According to an exemplary embodiment, the n-doped electron transporting layer is arranged at a side of the electron transporting layer facing the cathode. For example, the dopant for the n-doped electron injecting material is Ce or Li. The n-doped electron transporting layer decreases the electron injecting barrier of the OLED, which helps electrons to inject.

In a second aspect, embodiments of the present application provide a display device, which comprises the above OLED.

The display device according to embodiments of the present application has same or similar beneficial effects as the above OLED, which are not repeated here for simplicity.

In a third aspect, embodiments of the present application provide a method for fabricating an OLED, comprising forming a first electrode on a substrate; forming a first carrier transporting layer on the first electrode to form a light extracting layer; and forming an organic light emitting layer, a second carrier transporting layer, and a second electrode in this order on the light extracting layer.

According to an exemplary embodiment, the light extracting layer is formed between the first electrode and the organic light emitting layer to increase the light extracting efficiency of OLED. According to an exemplary embodiment, the first carrier transporting layer is patterned to form the light extracting layer which is arranged inside OLED. This is not only compatible with the existing OLED, but also simplifies the process for fabricating OLED.

In an exemplary embodiment of the method, forming the light extracting layer further comprises patterning the first carrier transporting layer to form the light extracting layer which has a periodic structure.

In an exemplary embodiment of the method, patterning the first carrier transporting material comprises nano-imprinting the first carrier transporting material by means of a nano-imprinting body.

According to an exemplary embodiment, a light extracting pattern is easily formed on the first carrier transporting material by nano-imprinting.

In an exemplary embodiment of the method, forming the first carrier transporting material on the first electrode comprises spin coating a polymer carrier transporting material on the first electrode to a thickness about 50-60 nm.

According to an exemplary embodiment, the light extracting layer is made from a polymer carrier transporting material. The polymer material is applied on the first electrode by spin coating, and can be patterned by nano-imprinting to form the periodic structure. The polymer carrier transporting material has a thickness about 50-60 nm, e.g. 55 nm.

In an exemplary embodiment of the method, after forming the first electrode and prior to forming the light extracting layer, the method further comprises spin coating on the first electrode a suspension which comprises an electrode modifying material in an organic solvent; and annealing the OLED on which the suspension has been spin coated to form an electrode modifying layer.

According to an exemplary embodiment, the electrode modifying layer can decrease the interface barrier between the first electrode and the organic material of the organic light emitting layer, so that carriers are efficiently injected, and the performance of OLED is increased.

In an exemplary embodiment of the method, the electrode modifying layer comprises $Al_2O_3$ or ZnO.

According to an exemplary embodiment, in case the electrode modifying material is $Al_2O_3$ or ZnO, a suspension is formed from an organic solvent and $Al_2O_3$ or ZnO, and the suspension is applied on the first electrode by spin coating for purpose of applying $Al_2O_3$ or ZnO on the first electrode.

In an exemplary embodiment of the method, the first electrode is a cathode, the first carrier transporting layer is an electron transporting layer, the second carrier transporting layer is a hole transporting layer, and the second electrode is an anode; and the method comprises forming the second electrode from a reflective material.

According to an exemplary embodiment, the OLED has an inverted configuration, and light is output from the cathode. The light extracting layer is arranged close to the light exit side in the OLED, so that light passes through the light extracting layer and then exits from the OLED. This facilitates increasing the light extracting efficiency of OLED.

In an exemplary embodiment of the method, forming the first electrode on the substrate comprises depositing ITO on the substrate; and performing ultraviolet and ozone treatment on ITO to form the first electrode.

According to an exemplary embodiment, the OLED is an inverted OLED. The OLED comprises a cathode which is arranged at the bottom and made from ITO. The cathode thus is directly connected with a drain of an n-type TFT, and this facilitates integration of the cathode and TFT to increase stability of the display device. The ITO cathode has a relatively high work function. There a relatively large electron injecting barrier between the ITO cathode and the electron transporting material, which makes it difficult for electrons to inject. The above mentioned electrode modifying layer helps to decrease the injecting barrier for electrons, so that this problem is solved.

DETAILED DESCRIPTION OF EMBODIMENTS

Figure 1A:
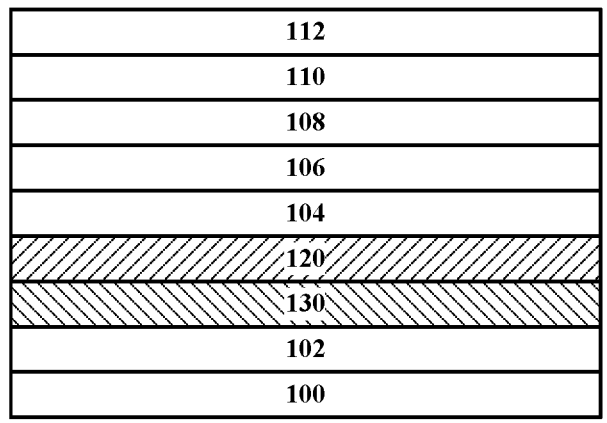
FIG. 1A is a schematic cross-sectional view for illustrating an OLED in an embodiment of the present application.

Specific embodiments of the present disclosure will be further described hereinafter with reference to the drawings and embodiments. The following embodiments are only used for explaining more clearly the technical solution of the present disclosure rather than limiting the protection scope of the present disclosure.

Reference numerals: 100, 200 substrate; 102 first electrode; 104 first carrier transporting layer; 106 organic light emitting layer; 108 second carrier transporting layer; 110 second carrier injecting layer; 112 second electrode; 120, 122, 220, 222, 224, 320, 322 light extracting layer; 130, 132, 230 electrode modifying layer; 202 cathode; 204 electron transporting layer; 206 organic light emitting layer; 208 hole transporting layer; 210 hole injecting layer; 212 anode; 240, 242, 244 n-doped electron transporting layer; 350, 352 imprinting body.

In an embodiment of the present application, an OLED is provided. In the embodiment shown in FIG. 1A, the OLED comprises a first electrode 102, a first carrier transporting layer 104, an organic light emitting layer 106, a second carrier transporting layer 108, and a second electrode 112 on a substrate 100. The OLED further comprises a light extracting layer 120 between the first electrode 102 and the first carrier transporting layer 104. The light extracting layer 120 is made from a first carrier transporting material.

In the embodiment shown in FIG. 1A, the OLED is a bottom emitting type. Accordingly, the substrate 100 is made from a transparent material, so that the light generated by the organic light emitting layer 106 can pass through the substrate 100. The light extracting layer 120 is arranged at the light exit side of OLED, thus increasing light extracting efficiency.

In certain exemplary embodiments, the OLED comprises a second carrier injecting layer 110 between the second carrier transporting layer 108 and the second electrode 112.

The OLED can also be a top emitting type. For example, in the embodiment shown in FIG. 1B, the OLED comprises the first electrode 102, the first carrier transporting layer 104, the organic light emitting layer 106, the second carrier transporting layer 108, and the second electrode 112 on the substrate 100. The OLED further comprises a light extracting layer 122 between the second electrode 112 and the second carrier transporting layer 108. In case the OLED comprises the second carrier injecting layer 110 which is arranged at a side of the second carrier transporting layer 108 away from the substrate 100, the light extracting layer 122 is arranged between the second electrode 112 and the second carrier injecting layer 110. The light extracting layer 122 is made from a second carrier transporting material.

Figure 1B:
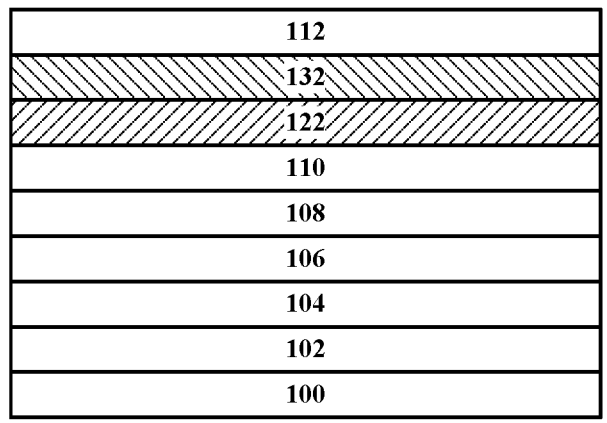
FIG. 1B is a schematic cross-sectional view for illustrating an OLED in an embodiment of the present application.

In the embodiment shown in FIG. 1B, the OLED is a top emitting type. The light extracting layer 122 is arranged at the light exit side of OLED, thus increasing light extracting efficiency.

As shown in FIG. 1A and FIG. 1B, by forming the light extracting layer at the light exit side of OLED from a corresponding carrier transporting material, it is possible to efficiently increase the light extracting efficiency of OLED. Since the light extracting layer is made from the corresponding carrier transporting material, the process for forming the light extracting layer is compatible with the existing process for fabricating OLED, especially with the process for forming the corresponding carrier transporting layer, so that it is easy to fabricate and the cost can be efficiently controlled.

As an example, the light extracting layer 120, 122 is made from a polymer carrier transporting material. In this case, the polymer material applied on the electrode by spin coating, and is patterned by nano-imprinting to form the periodic structure. The light extracting layer made from the polymer material is relatively dense, and isolates the organic light emitting layer from the environment. This prevents environmental factors like moisture from destroying the organic material in the organic light emitting layer, thus increasing the lifetime of OLED.

A surface of the light extracting layer 120, 122 has a periodic structure. The periodic structure comprises one-dimensional prisms which have a triangular or curved cross section. In certain exemplary embodiments, the periodic structure comprises periodic patterns which are arranged in a matrix. The light extracting layer which has the periodic structure in the surface facilitates increasing the light extracting efficiency of OLED. Besides, these one-dimensional prisms and periodic patterns which are arranged in a matrix are easy to fabricate. However, the present application is not limited in this regard. For example, the surface of the light extracting layer may have a quasi-periodic structure or a non-periodic structure, as long as the structure can increase the light extracting efficiency of OLED.

The light extracting layer 120, 122 is made from any known carrier transporting material. In the embodiment shown in FIG. 1A, the light extracting layer 120 is made from a same material as the first carrier transporting layer 104. In the embodiment shown in FIG. 1B, the light extracting layer 122 is made from a same material as the second carrier transporting layer 108 or the second carrier injecting layer 110. For example, in case the first electrode 102 is a cathode made from ITO, the light extracting layer 120 is made from any known electron transporting material, e.g., poly(3,4-ethylenedioxythiophene)/poly(styrene sulfonate) (PEDOT:PSS).

As shown in FIG. 1A, the OLED further comprises an electrode modifying layer 130 between the first electrode 102 and the light extracting layer 120. The electrode modifying layer 130 decreases the interface barrier between the first electrode 102 and the organic material of the organic light emitting layer 106, so that the first carriers are injected efficiently, which increases the performance of OLED. In case the first electrode 102 is a cathode, the electrode modifying layer 130 is made from $Al_2O_3$ or ZnO. The electrode modifying layer 130 has a thickness about 1-3 nm.

Similarly, in the embodiment shown in FIG. 1B, the OLED comprises an electrode modifying layer 132 between the light extracting layer 122 and the second electrode 112. The electrode modifying layer 132 facilitates injecting the second carriers from the second electrode 112.

In the embodiments shown in FIG. 1A and FIG. 1B, the first carriers are electrons, and the second carriers are holes. Accordingly, the first electrode 102 is a cathode, the first carrier transporting layer 104 is an electron transporting layer, the second carrier transporting layer 108 is a hole transporting layer, the second carrier injecting layer 110 is a hole injecting layer, and the second electrode 112 is an anode.

In the embodiment shown in FIG. 1A, the OLED has an inverted configuration, the substrate 100 is transparent substrate, and light is output from the first electrode 102 (namely, from the substrate 100). As an example, the second electrode 112 is made from a reflective material, e.g., a reflective metal layer, so as to further increase the light extracting efficiency of OLED. As an example, in case the first electrode 102 is a cathode, the first electrode 102 is made from ITO.

OLEDs in embodiments of the present application will be described hereinafter with reference to FIGS. 2A, 2B and 2C. In particular, these OLEDs are inverted OLEDs (IOLED).

Figure 2A:
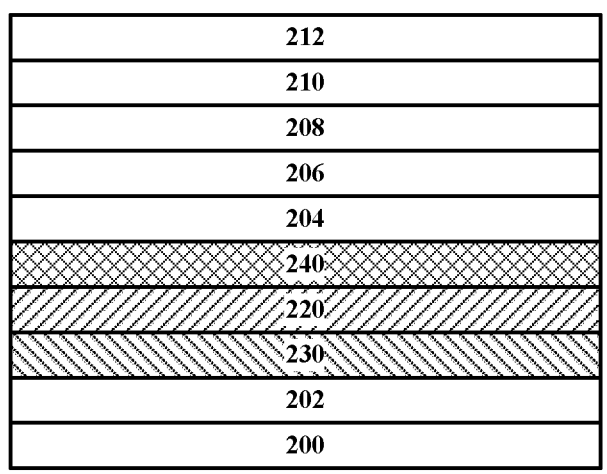
FIGS. 2A, 2B and 2C are schematic cross-sectional views for illustrating inverted OLEDs in embodiments of the present application.

FIG. 2A shows an inverted OLED according to an embodiment of the present application. As shown, the OLED comprises a cathode 202, an electron transporting layer 204, an organic light emitting layer 206, a hole transporting layer 208, and an anode 212, which are arranged on a substrate 200 in this order. In certain exemplary embodiments, the OLED further comprises a hole injecting layer 210 between the hole transporting layer 208 and the anode 212. The electron transporting layer 204 is generally made from an undoped electron transporting material, but the present application is not limited in this regard. The OLED further comprises a light extracting layer 220 which is arranged at the light exit side and an electrode modifying layer 230 which is arranged on the cathode 202. The light extracting layer 220 and the electrode modifying layer 230 shown in FIG. 2A are similar to the light extracting layer 120 and the electrode modifying layer 130 shown in FIG. 1A, which are not repeated here for simplicity.

As shown in FIG. 2A, for example, the OLED further comprises an n-doped electron transporting layer 240, which is arranged at a side of the electron transporting layer 204 facing the cathode 202. The n-doped electron transporting layer is made from an electron transporting material doped with an n-type dopant. For example, the n-type dopant is Ce or Li. The n-doped electron transporting layer 240 decreases the injecting barrier for electrons, which increases the efficiency for injecting electrons, and further increases the performance of OLED.

It is noted that OLED further comprises other functional layers such as an electron blocking layer, a hole blocking layer. These functional layers are known for the ordinary skilled person in the art, and thus are not repeated here for simplicity.

As compared with a conventional non-inverted OLED, the inverted OLED can be integrated with the n-type TFT more easily. Currently, a TFT with an IGZO (indium gallium zinc oxide) active layer provides a better match with the inverted OLED. In the inverted OLED, in case ITO is used the transparent cathode, OLED is directly connected with the drain of n-type TFT, and this facilitates integration of the cathode and TFT to increase stability of the display device. In this case, the substrate 200 in FIG. 2A is an n-type TFT. However, since ITO has a relatively high work function, so that electrons are subject to a relatively high injecting barrier, the efficiency for injecting electrons is low, and the performance of OLED is affected. According to the present embodiment, the electrode modifying layer 230 is formed on the cathode 202, injecting barrier for electrons are efficiently decreased, so that the above problem about integration the inverted OLED and the n-type TFT is solved.

The electrode modifying layer 230 comprises $Al_2O_3$ or ZnO, so as to efficiently decrease the surface work function of the cathode 202 for increasing electron injecting capability. The electrode modifying layer 230 generally has a thickness about 1-3 nm, e.g., 1.5 nm or 2 nm. The electrode modifying layer 230 becomes an insulating layer when it is too thick, and this is disadvantageous for the electrical performance of inverted OLED. In case the electrode modifying layer 230 comprises $Al_2O_3$ or ZnO, the electrode modifying layer 230 is formed as follow. A suspension comprising $Al_2O_3$ or ZnO in an organic solvent is spin coated, and the OLED is annealed to form a dense $Al_2O_3$ or ZnO film. The dense electrode modifying layer 230 isolates the organic light emitting layer 206 from the environment. This prevents environmental factors like moisture from destroying the organic material in the organic light emitting layer, which is favorable for the lifetime of inverted OLED.

Similar with the embodiment of FIG. 1A, for example, the inverted OLED further comprises the light extracting layer 220 which is arranged between the cathode 202 and the electron transporting layer 204. In certain exemplary embodiments, as shown in FIG. 2A, the light extracting layer 220 is arranged between the electrode modifying layer 230 and the n-doped electron transporting layer 240.

The light extracting layer 220 is arranged at the light exit side of the inverted OLED, thus increasing light extracting efficiency. The light extracting layer 220 is made from an electron transporting material, thus efficiently increasing the light extracting efficiency of inverted OLED, without adversely affecting injecting and transporting of electrons. As an example, the light extracting layer 220 is made from a polymer carrier transporting material, so that it is applied on the cathode 202 by spin coating and is nano-imprinted to form a periodic structure. As an example, a surface of the light extracting layer 220 has a periodic structure which comprises one-dimensional prisms which have a triangular or curved cross section, or periodic patterns which are arranged in a matrix. This facilitates increasing the light extracting efficiency of inverted OLED.

Figure 2B:
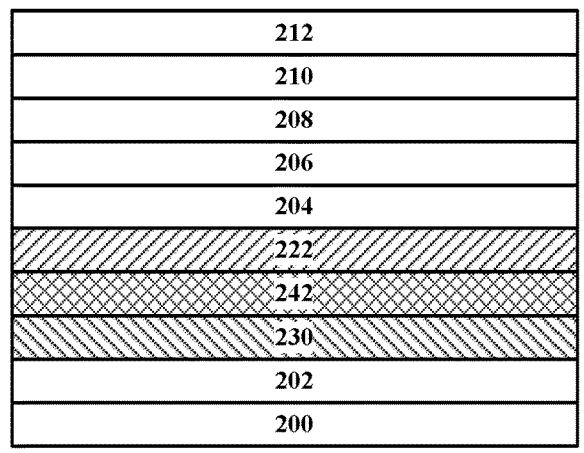

FIG. 2B shows an inverted OLED in another embodiment of the present application. As shown, the inverted OLED comprises the cathode 202, the electrode modifying layer 230, the n-doped electron transporting layer 242, a light extracting layer 222, the electron transporting layer 204, the organic light emitting layer 206, the hole transporting layer 208, the hole injecting layer 210, and the anode 212, which are arranged on the substrate 200 in this order. As compared with the embodiment of FIG. 2A, in the embodiment shown in FIG. 2B, the light extracting layer 222 is arranged between the n-doped electron transporting layer 242 and the electron transporting layer 204.

Figure 2C:
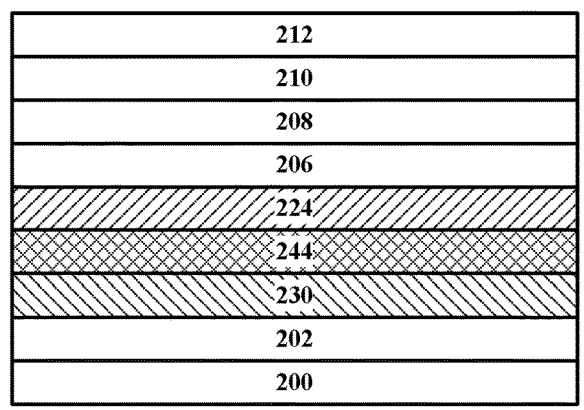

FIG. 2C shows an inverted OLED in yet another embodiment of the present application. As shown, the inverted OLED comprises the cathode 202, the electrode modifying layer 230, the n-doped electron transporting layer 244, a light extracting layer 224, the organic light emitting layer 206, the hole transporting layer 208, the hole injecting layer 210, and the anode 212, which are arranged on the substrate 200 in this order. As compared with the embodiment of FIG. 2B, the inverted OLED of FIG. 2C does not comprise an individual electron transporting layer. The light extracting layer 224 is arranged between the n-doped electron transporting layer 244 and the organic light emitting layer 206. As an example, the light extracting layer 224 is made from an undoped electron transporting material. In the present embodiment, the light extracting layer 224 not only improves the light extracting efficiency, but also acts as an electron transporting layer in the inverted OLED.

Figure 3A:
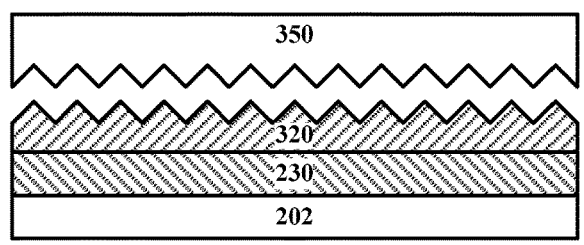
FIG. 3A is a schematic cross-sectional view for illustrating a light extracting layer in an embodiment of the present application.
Figure 3B:
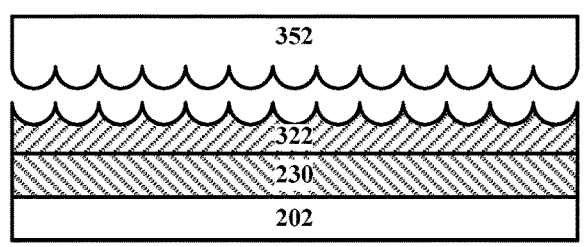
FIG. 3B is a schematic cross-sectional view for illustrating a light extracting layer in an embodiment of the present application.

FIG. 3A and FIG. 3B show different embodiments of a light extracting layer of the present application.

As shown by the cross-sectional view in FIG. 3A, after the electrode modifying layer 230 is formed on the cathode 202, a film of polymer carrier transporting material is formed on the electrode modifying layer 230 by spin coating. As an example, the film has a thickness about 50-60 nm, e.g., 55 nm. Then, the film of polymer carrier transporting material is nano-imprinted by an imprinting body 350, and a pattern of the imprinting body 350 is transferred to the film of polymer carrier transporting material, thus forming a light extracting layer 320. As shown in FIG. 3A, the light extracting layer 320 comprises one-dimensional prisms which have a triangular cross section.

As shown by the cross-sectional view of FIG. 3B, after the electrode modifying layer 230 is formed on the cathode 202, a film of polymer carrier transporting material is formed on the electrode modifying layer 230 by spin coating. Then, the film of polymer carrier transporting material is nano-imprinted by an imprinting body 352, and a pattern of the imprinting body 352 is transferred to the film of polymer carrier transporting material, thus forming a light extracting layer 322. As shown in FIG. 3B, the light extracting layer 320 comprises one-dimensional prisms which have a curved (wave shaped) cross section.

In the embodiments shown in FIG. 3A and FIG. 3B, the surface of the light extracting layer 320, 322 has a periodic structure comprising one-dimensional prisms which have a triangular or curved cross section. However, the present application is not limited in this regard. The light extracting layer may comprise periodic patterns which are arranged in a matrix. Besides, it is possible for the surface of the light extracting layer to have a quasi-periodic structure or non-periodic structure, as long as this structure increases the light extracting efficiency of OLED.

The imprinting body 350, 352 is fabricated by forming a specific pattern on an imprinting substrate (not shown) via electron beam deposition, laser direct writing, chemical synthesis, self-assembling, or the like. The specific pattern is complementary with the pattern which is desired to be formed on the surface of the light extracting layer.

It is noted that the light extracting layer 320, 322 shown in FIGS. 3A and 3B is applicable to the light extracting layer 120, 122, 220, 222, 224 in OLED shown in FIGS. 1A-1B, 2A-2C. For sake of simplicity, the surface morphology of the light extracting layer 120, 122, 220, 222, 224 is not shown in FIGS. 1A-1B, 2A-2C.

Furthermore, in case the above light extracting layer is formed in OLED, functional layers in OLED, e.g., the electron transporting layer, the organic light emitting layer, the hole transporting layer, the hole injecting layer, and the anode, are formed on the light extracting layer in this order and conform to the surface morphology of the light extracting layer. Namely, each functional layer formed on the light extracting layer also has a same periodic structure as the light extracting layer, which further increases the light extracting efficiency of OLED. According to an embodiment of the present application, a display device is provided, which comprises the OLED as described above. The display device can be any product or component with a display function like a mobile phone, tablet computer, TV, monitor, notebook computer, digital photo frame, and navigator. As known for the ordinary skilled person in the art, apart from the OLED, the display device further comprises other components like a driving circuit. These components are known in the art, and thus are not repeated here for simplicity.

Figure 4:
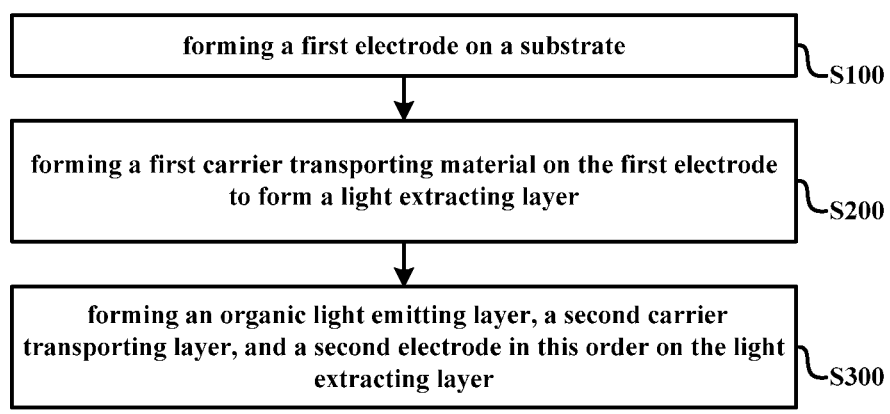
FIG. 4 is a flow chart for illustrating a method for fabricating an OLED in an embodiment of the present application.

According to an embodiment of the present application, a method for fabricating an OLED is provided. As shown in FIG. 4, the method comprises steps of:

S100, forming a first electrode on a substrate;

S200, applying a first carrier transporting material on the first electrode, and patterning the first carrier transporting material to form a light extracting layer with a periodic structure; and S300, forming an organic light emitting layer, a second carrier transporting layer, and a second electrode in this order on the light extracting layer.

As an example, patterning the first carrier transporting material comprises: nano-imprinting the first carrier transporting material by means of a nano-imprinting body.

As an example, forming the first carrier transporting material on the first electrode comprises: spin coating a polymer carrier transporting material on the first electrode to a thickness about 50-60 nm.

As an example, after forming the first electrode and prior to forming the light extracting layer, the method further comprise: spin coating on the first electrode a suspension which comprises an electrode modifying material in an organic solvent; and annealing the OLED on which the suspension has been spin coated to form an electrode modifying layer.

As an example, the electrode modifying layer comprises $Al_2O_3$ or ZnO.

As an example, the first electrode is a cathode, the first carrier transporting layer is an electron transporting layer, the second carrier transporting layer is a hole transporting layer, and the second electrode is an anode; and the method comprises forming the second electrode from a reflective material.

As an example, forming the first electrode on the substrate comprise: depositing ITO on the substrate; and performing ultraviolet and ozone treatment on ITO to form the first electrode.

In an exemplary embodiment, the method comprises the following steps.

The cathode 202, which is made from ITO, is formed on the substrate 200. An ultraviolet and ozone treatment is performed on the surface of the cathode 202. In a non-inverted OLED, it is generally not required to perform ultraviolet and ozone treatment on the ITO cathode. However, in the inverted OLED, after deposition of ITO, ultraviolet and ozone treatment is generally performed on ITO to decrease the work function of cathode.

A layer of oxide precursor suspension is spin coated on the cathode 202 for modifying the surface of ITO. For example, the oxide is $Al_2O_3$ or ZnO, which acts to decrease the work function of ITO to increase electron injecting capability. Then, the OLED on which the oxide precursor suspension has been spin coated is annealed, to form a dense oxide film, i.e., the electrode modifying layer 230. In certain exemplary embodiments, prior to annealing, the oxide precursor suspension is subject to drying treatment. As an example, the electrode modifying layer 230 has a thickness about 1-3 nm, e.g., 1.5 nm or 2 nm.

A film of polymer electron transporting material is spin coated on the electrode modifying layer 230. As an example, the film has a thickness about 50-60 nm, e.g., 55 nm. The film is nano-imprinted by an imprinting body which is prepared in advance, to form a periodic structure, thus forming the light extracting layer 220.

The structure resulting from the previous step is transferred to a vacuum deposition chamber. The n-doped electron transporting layer 240, the (undoped) electron transporting layer 204, the organic light emitting layer 206, the hole transporting layer 208, the hole injecting layer 210, and reflective the anode 212 are deposited in this order on the light extracting layer 220 with the periodic structure.

From the above steps, the inverted OLED with an improved light extracting efficiency shown in FIG. 2A is obtained.

The process for fabricating the inverted OLED shown in FIG. 2A has been described above. On basis of the disclosure of the present application, the ordinary skilled person in the art will know the process for fabricating OLEDs shown in FIGS. 2B-2C and FIGS. 1A-1B, which are not repeated here for simplicity.

According to embodiments of the present application, the light extracting layer is formed between the first electrode and the organic light emitting layer in the OLED from a first carrier transporting material. This increases the light extracting efficiency of OLED. The light extracting layer further acts as the first carrier transporting layer, thus simplifying the structure of OLED, so that it is easy to fabricate and the cost can be efficiently controlled.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. An OLED comprising:
   a first electrode;
   an organic light emitting layer;
   a second carrier transporting layer;
   a second electrode;
   a light extracting layer arranged between the first electrode and the organic light emitting layer, wherein the light extracting layer is made from an undoped first carrier transporting material;
   a first carrier transporting layer arranged between the organic light emitting layer and the light extracting layer, wherein the first carrier transporting layer is made from the undoped first carrier transporting material;
   an electrode modifying layer arranged between the first electrode and the light extracting layer; and
   a doped first carrier transporting layer arranged between the light extracting layer and the first carrier transporting layer,
   wherein the first electrode is a cathode comprising ITO, and the electrode modifying layer is made from $Al_2O_3$ to decrease an interface barrier between the first electrode and the organic light emitting layer.

2. The OLED of claim 1, wherein the doped first carrier transporting layer is an n-doped electron transporting layer.

3. The OLED of claim 1, wherein the light extracting layer is arranged close to a light exit side in the OLED.

4. The OLED of claim 1, wherein a surface of the light extracting layer has a periodic structure.

5. The OLED of claim 4, wherein the periodic structure comprises one-dimensional prisms which have a triangular or curved cross section, or periodic patterns which are arranged in a matrix.

6. The OLED of claim 1, wherein the light extracting layer has a thickness about 50-60 nm.

7. The OLED of claim 1, wherein the second electrode is an anode, wherein each of the first carrier transporting layer, the organic light emitting layer, the second carrier transporting layer and the anode has a same periodic structure as the surface of the light extracting layer.

8. The OLED of claim 1, wherein the electrode modifying layer is made from $Al_2O_3$ and has a thickness of about 1-3 nm.

9. The OLED of claim 1, wherein the light extracting layer is made from a polymer carrier transporting material.

10. A display device comprising the OLED of claim 1.

* * * * *